United States Patent
Fang et al.

(10) Patent No.: US 7,816,159 B2
(45) Date of Patent: Oct. 19, 2010

(54) METHOD FOR FABRICATING PIXEL STRUCTURE

(75) Inventors: Kuo-Lung Fang, Hsinchu (TW);
Chih-Chun Yang, Hsinchu (TW);
Ming-Yuan Huang, Hsinchu (TW);
Han-Tu Lin, Hsinchu (TW);
Chih-Hung Shih, Hsinchu (TW);
Ta-Wen Liao, Hsinchu (TW);
Shiun-Chang Jan, Hsinchu (TW);
Chia-Chi Tsai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 277 days.

(21) Appl. No.: 12/105,279

(22) Filed: Apr. 18, 2008

(65) Prior Publication Data
US 2009/0148972 A1 Jun. 11, 2009

(30) Foreign Application Priority Data
Dec. 10, 2007 (TW) .............................. 96147036 A

(51) Int. Cl.
*H01L 21/00* (2006.01)
(52) U.S. Cl. .................. 438/30; 438/151; 438/158; 257/E33.065; 257/E21.002
(58) Field of Classification Search .................. 438/30, 438/129, 34, 599, 609, 158, 151, 149; 257/E33.065, 257/E21.002, E21.001, E21.411, E29.147, 257/E21.414
See application file for complete search history.

(56) References Cited

U.S. PATENT DOCUMENTS

| 5,514,618 | A | 5/1996 | Hunter, Jr. et al. |
| 7,064,347 | B2 | 6/2006 | Chang et al. |
| 2005/0179036 | A1 | 8/2005 | Yamazaki et al. |
| 2006/0008952 | A1* | 1/2006 | Wu et al. ................ 438/149 |
| 2006/0099747 | A1* | 5/2006 | Park ........................ 438/158 |
| 2006/0119779 | A1* | 6/2006 | Chang et al. ............ 349/149 |
| 2007/0155145 | A1* | 7/2007 | Hong ....................... 438/584 |

FOREIGN PATENT DOCUMENTS

| CN | 1728363 | 2/2006 |
| CN | 101013655 | 8/2007 |

* cited by examiner

*Primary Examiner*—Davienne Monbleau
*Assistant Examiner*—Shweta Mulcare
(74) *Attorney, Agent, or Firm*—Jianq Chyun IP Office

(57) ABSTRACT

A method for fabricating a pixel structure includes following steps. First, a substrate is provided. Next, a first conductive layer is formed on the substrate. Next, a first shadow mask is disposed over the first conductive layer. Next, a laser is applied through the first shadow mask to irradiate the first conductive layer to form a gate. Next, a gate dielectric layer is formed on the substrate to cover the gate. After that, a channel layer, a source and a drain are simultaneously formed on the gate dielectric layer over the gate, wherein the gate, the channel layer, the source and the drain together form a thin film transistor. A patterned passivation layer is formed on the thin film transistor and the patterned passivation layer exposes a part of the drain. Furthermore, a pixel electrode electrically connecting to the drain is formed.

17 Claims, 12 Drawing Sheets

METHOD FOR FABRICATING PIXEL STRUCTURE

CROSS-REFERENCE TO RELATED APPLICATION

This application claims the priority benefit of Taiwan application serial no. 96147036, filed on Dec. 10, 2007. The entirety the above-mentioned patent application is hereby incorporated by reference herein and made a part of specification.

BACKGROUND OF THE INVENTION

1. Field of the Invention

The present invention generally relates to a method for fabricating a pixel structure, and more particularly, to a method for fabricating a passivation layer by a laser ablation process.

2. Description of Related Art

Among displays, as interfaces between man and information, a flat display plays a major role in development tendency of the display technology today. A flat display is mainly categorized into organic electroluminescence display (OELD), plasma display, and thin film transistor liquid crystal display (TFT LCD), wherein the TFT LCD is counted as the most popular one. In general, a TFT LCD is mainly composed of a thin film transistor array substrate, a color filter substrate and a liquid crystal layer. A TFT array substrate includes a plurality of scan lines, a plurality of data lines and a plurality of pixel structures arranged in array, and each pixel structure is respectively electrically connected to a corresponding scan line and a corresponding data line.

FIGS. 1A-1G are flowchart diagrams for fabricating a conventional pixel structure. First referring to FIG. 1A, a substrate 10 is provided and then a gate 20 is formed on the substrate 10 by using a first photolithography and etching process. Next referring to FIG. 1B, a gate dielectric layer 30 is formed on the substrate 10 to cover the gate 20. Next, referring to FIG. 1C, a channel layer 40 is formed over the gate 20 and on the gate dielectric layer 30 by using a second photolithography and etching process, wherein the channel layer 40 is usually made of amorphous silicon (a-Si). After that referring to FIG. 1D, a source 50 and a drain 60 are formed on a partial region of the channel layer 40 and a partial region of the gate dielectric layer 30 by using a third photolithography and etching process; and it can be seen from FIG. 1D that the source 50 and the drain 60 are respectively extended from both sides of the channel layer 40 onto the gate dielectric layer 30 and expose a partial region of the channel layer 40. Further referring to FIG. 1E, a passivation layer 70 is formed on the substrate 10 to cover the gate dielectric layer 30, the channel layer 40, the source 50 and the drain 60. Furthermore referring to FIG. 1F, a fourth photolithography and etching process is used to pattern the passivation layer 70 so as to form a via hole H in the passivation layer 70. As shown in FIG. 1F, the via hole H in the passivation layer 70 exposes a portion of the drain 60. Moreover as shown in FIG. 1G, a fifth photolithography and etching process is used to form a pixel electrode 80 on the passivation layer 70. Referring to FIG. 1G, the pixel electrode 80 can be electrically connected to the drain 60 through the via hole H. After completing the pixel electrode 80, the whole pixel structure 90 is completed as well.

According to the above description, a conventional pixel structure 90 is fabricated by using five photolithography and etching processes, which means a pixel structure 90 requires five photo-masks with different patterns. Since a photo-mask is very expensive and each photolithography and etching process requires photo-masks with different patterns; thus, by reducing the number of the photolithography and etching processes, the fabrication cost of the pixel structure 90 can be effectively reduced.

In addition, along with increasing size of a TFT LCD panel, the photo-mask size for fabricating the TFT LCD panel is accordingly larger. A photo-mask with large dimension even would cost much more, so that the fabrication cost of a pixel structure 90 fails to be effectively reduced.

SUMMARY OF THE INVENTION

Accordingly, the present invention is directed to a method for fabricating a pixel structure suitable for reducing the fabrication cost thereof.

The present invention provides a method for fabricating a pixel structure. First, a substrate is provided and a first conductive layer is formed on the substrate. Next, a first shadow mask is provided and placed over the first conductive layer, wherein the first shadow mask exposes a part of the first conductive layer, so that laser is able to pass through the first shadow mask to irradiate the first conductive layer and then the exposed part of the first conductive layer can be removed to form a gate. Next, a gate dielectric layer is formed over the substrate to cover the gate. After that, a channel layer, a source and a drain are simultaneously formed on the gate dielectric layer over the gate, wherein the source and the drain are disposed on the partial portions of the channel layer, and the gate, the channel layer, the source and the drain together form a TFT. Furthermore, a patterned passivation layer is formed on the TFT and a portion of the drain is exposed. Furthermore, a pixel electrode electrically connected to the drain is formed.

In the method for fabricating a pixel structure, a method of simultaneously forming the channel layer, the source and the drain includes, for example, the following steps. First, a semiconductor layer is formed on the gate dielectric layer. Next, a second conductive layer is formed on the semiconductor layer. Next, a photoresist layer is formed on the second conductive layer over the gate, wherein the photoresist layer is divided into a first photoresist block and a second photoresist block connected at both sides of the first photoresist block, and the thickness of the first photoresist block is less than the thickness of the second photoresist block. After that, the photoresist layer is used as a mask to perform a first etching process on the second conductive layer and the semiconductor layer. Further, the photoresist layer is reduced until the first photoresist block is completely removed. Furthermore, the remaining second photoresist block is taken as a mask to perform a second etching process on the second conductive layer, so that the residual second conductive layer forms the source and the drain and the residual semiconductor layer forms the channel layer. In other embodiments, a method of fabricating the channel layer, the source and the drain includes the following steps. First, the semiconductor layer is formed. Next, an ohmic contact layer is formed on the surface of the semiconductor layer. Next, a first etching process and a second etching process are performed to remove the Ohmic contact layer exposed by the second photoresist block. The method of reducing the photoresist layer includes an ashing process.

In the method for fabricating a pixel structure, a method of forming the patterned passivation layer includes, for example, the following steps. First, after simultaneously forming the channel layer, the source and the drain a passivation layer is formed on the gate dielectric layer and the TFT.

Next, the passivation layer is patterned. In another embodiment, a method of forming the patterned passivation layer includes as the following steps. First, after simultaneously forming the channel layer, the source and the drain, a passivation layer is formed on the gate dielectric layer and the TFT. Next, a second shadow mask is provided and placed over the passivation layer and a portion of the passivation layer is exposed. Next, a laser is applied and passes through the second shadow mask to irradiate the passivation layer to remove the part exposed by the second shadow mask of the passivation layer. In other embodiments, a method of forming the patterned passivation layer is described as follows. First, after simultaneously forming the channel layer, the source and the drain, a photoresist layer is formed on a portion of the drain. Next, a passivation layer is formed to cover the gate dielectric layer, the TFT and the photoresist layer. Next, the passivation layer is removed, so that the passivation layer on the photoresist layer is also removed. In yet another embodiment, a method of forming the patterned passivation layer is described as follows. First, a passivation layer is formed on the gate dielectric layer and the remained second photoresist block. Next, the remained second shadow mask together with the passivation layer is removed. The method of removing the above-mentioned photoresist layer includes a lift-off process.

In the method for fabricating a pixel structure, a method of forming the pixel electrode includes, for example, the following steps. In an embodiment, first, after forming the patterned passivation layer, an electrode material layer is formed on the passivation layer and the TFT. Next, the electrode material layer is patterned. In another embodiment, a method of forming the pixel electrode is described as follows. First, after forming the patterned passivation layer an electrode material layer is formed on the passivation layer and the TFT. Next, a third shadow mask is provided over the electrode material layer to expose a part of the electrode material layer. Next, a laser is applied through the third shadow mask to irradiate the electrode material layer so as to remove the part exposed by the third shadow mask of the electrode material layer. In other embodiments, a method of forming the pixel electrode is described as follows. First a photoresist layer is formed on the patterned passivation layer, wherein a portion of the drain is exposed. Next, an electrode material layer is formed to cover the patterned passivation layer, the drain and the photoresist layer. The method of forming the above-mentioned electrode material layer includes performing a sputtering process to form an indium tin oxide layer (ITO layer) or an indium zinc oxide layer (IZO) layer. In addition, the method of removing the above-mentioned photoresist layer includes a laser lift-off process.

In the method for fabricating a pixel structure, the method of forming the patterned passivation layer and the pixel electrode can also include, for example, after forming the TFT, a passivation layer is formed on the gate dielectric layer and the TFT, followed by forming a photoresist layer on the passivation layer to pattern the passivation layer and expose a portion of the drain and a gate contact pad, wherein the photoresist layer is divided into a third photoresist block and a fourth photoresist block and the thickness of the third photoresist block is less than the thickness of the fourth photoresist block. Next, the photoresist layer is reduced until the third photoresist block is completely removed. After that, an electrode material layer is formed to cover the patterned passivation layer, the drain and the photoresist layer. Further, the photoresist layer is removed, wherein the electrode material layer on the photoresist layer is also removed as well.

In the method for fabricating a pixel structure, the laser energy used to irradiate the first conductive layer is between 10 and 500 mJ/cm$^2$. In addition, the laser wavelength is between 100 nm and 400 nm.

The present invention uses laser ablation process to fabricate the gate and simultaneously complete the channel layer, the source and the drain. Therefore, compared to the prior art, the method for fabricating a pixel structure according to the present invention is able to reduce the fabrication cost by reducing the number of photolithography and etchings. Besides, during fabricating the gate, the shadow mask employed by the laser ablation process is more simple compared to the prior art which requires high precision photomasks, which contributes to further reduce the fabrication cost.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
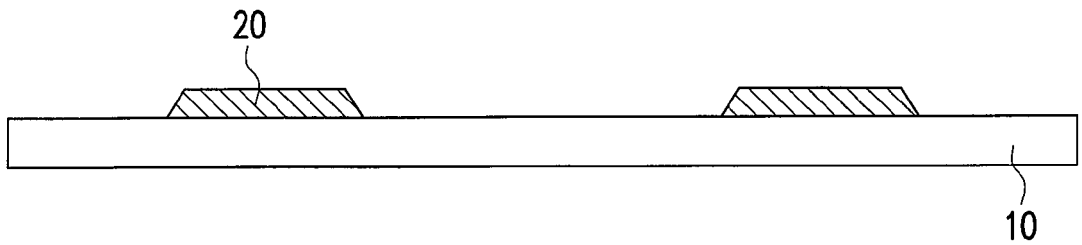
FIGS. 1A-1G are flowchart of a method for fabricating a conventional pixel structure.
Figure 1B:
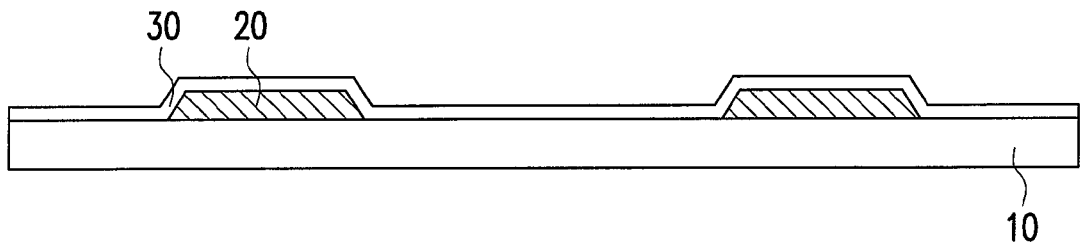
Figure 1C:
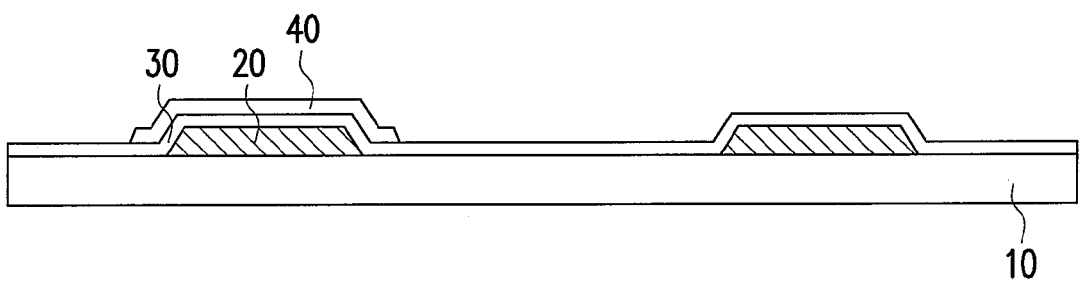
Figure 1D:
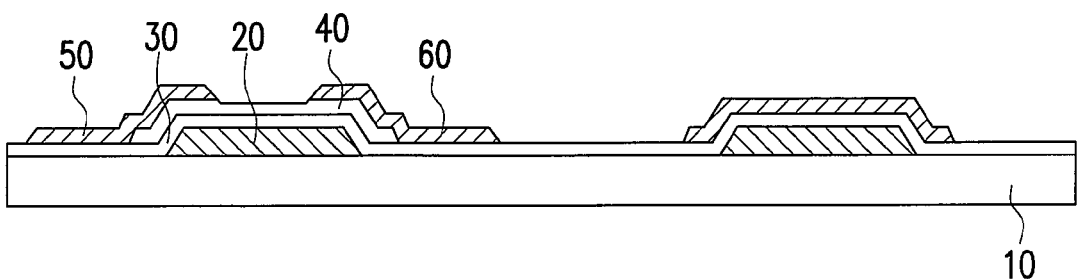
Figure 1E:
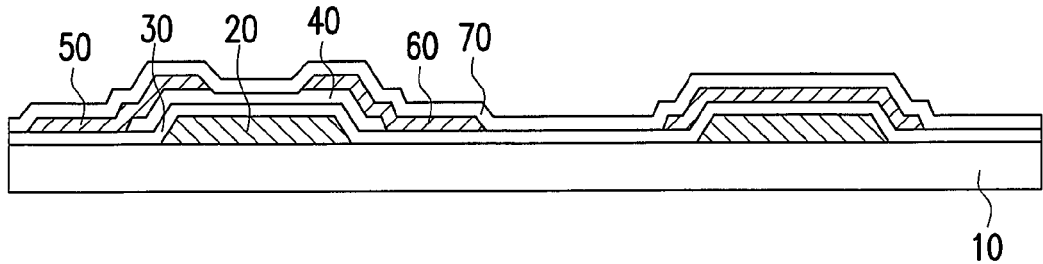
Figure 1F:
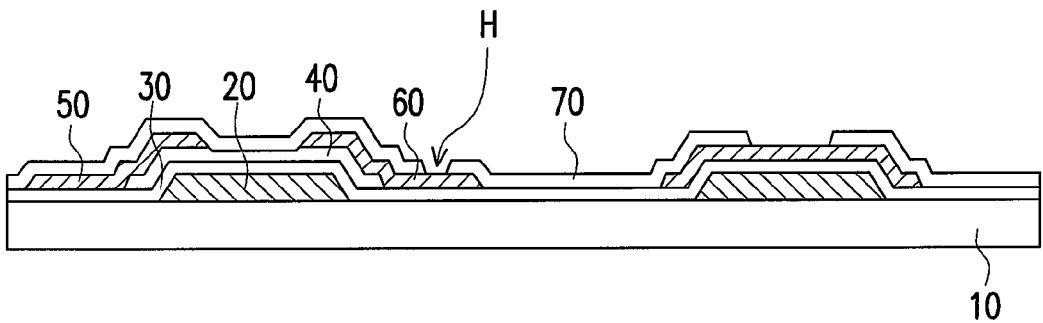
Figure 1G:
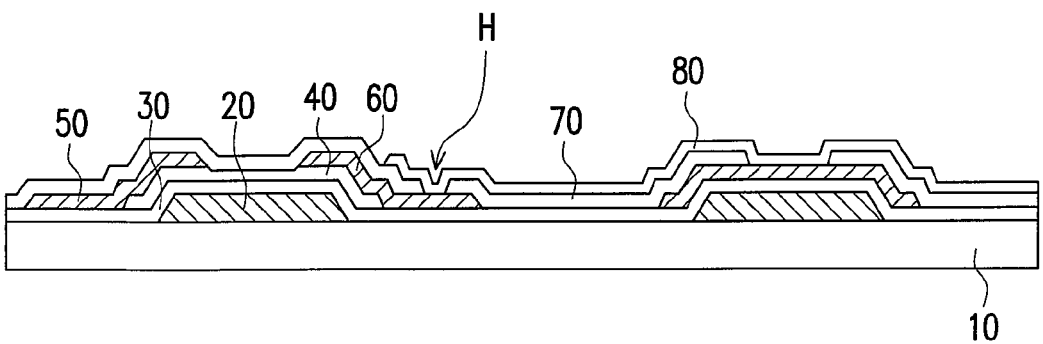

Reference will now be made in detail to the present preferred embodiments of the invention, examples of which are illustrated in the accompanying drawings. Wherever possible, the same reference numbers are used in the drawings and the description to refer to the same or like parts.

FIGS. 2A-2I are diagrams of a fabrication method of a pixel structure provided by the present invention. First, referring to FIG. 2A, a substrate 200 is provided, and the substrate 200 is made of, for example, glass or plastic etc, a hard material or a soft material. Next, a first conductive layer 210 is formed on the substrate 200, wherein the first conductive layer 210 is formed by using, for example, sputtering, evaporation or other thin film deposition process.

Figure 2A:
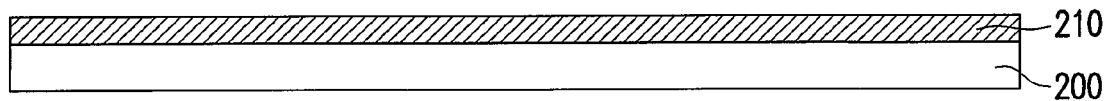
FIGS. 2A-2I are diagrams illustrating a method for fabricating a pixel structure according to the present invention.
Figure 2B:
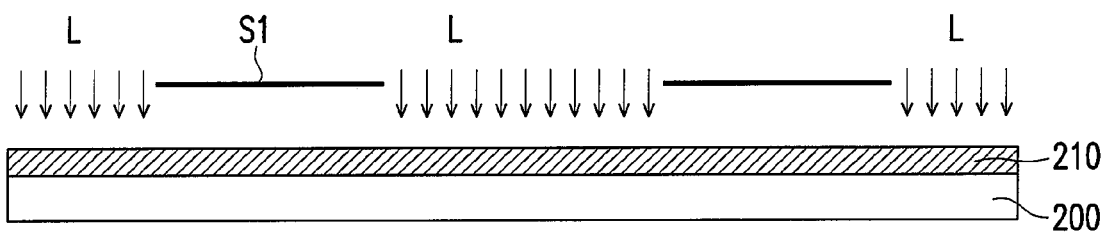

Next referring to FIG. 2B, a first shadow mask S1 is placed over the first conductive layer 210, wherein the first shadow mask S1 exposes a portion of the first conductive layer 210. Laser L is applied through the first shadow mask S1 to irradiate the first conductive layer 210. In more detail, after the irradiation of the laser L, the first conductive layer 210 would absorb the energy of the laser L and be ablated from the surface of the substrate 200. The energy of the laser L applied for ablating the first conductive layer 210 comprises, for example, is ranged from 10 mJ/cm² to 500 mJ/cm². Besides, the wavelength of the laser L is, for example, between 100 nm and 400 nm.

Figure 2C:

Next referring to FIG. 2C, after removing the exposed portion, the remained first conductive layer 210 forms a gate 212. Note that differently from the prior art where expensive photolithography and etching is used to fabricate the gate 212, the present invention uses more simplify shadow mask S1 to fabricate the gate 212, therefore, the fabrication cost is reduced.

Figure 2D:
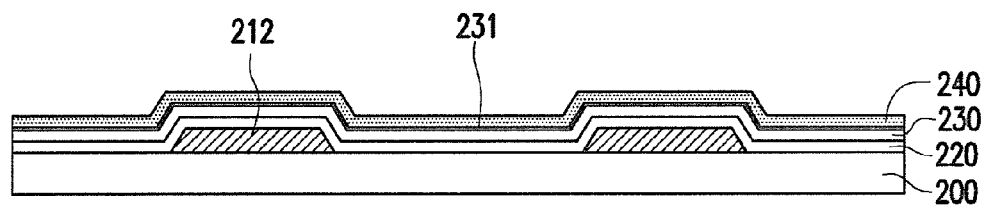

Next referring to FIG. 2D, a gate dielectric layer 220 is formed on the substrate 200 to cover the gate 212, wherein the gate dielectric layer 220 is formed by using, for example, a chemical vapor deposition (CVD) process or other appropriate thin film deposition process. The material of the gate dielectric layer 220 includes a dielectric material, for example, silicon oxide ($SiO_x$), silicon nitride ($SiN_x$) or silicon nitride oxide ($SiN_xO_y$) etc. Next, a semiconductor layer 230 and a second conductive layer 240 are sequentially formed on the gate dielectric layer 220. In the embodiment, the material of the semiconductor layer 230 includes, for example, amorphous silicon (a-Si) or other semiconductor materials; the material of the second conductive layer 240 includes, for example, Al, Mo, Ti, Nd; or the nitrides of the above-mentioned metals, for example, MoN or TiN; or the stacked layers of the above-mentioned metals and nitrides; or the alloys of the above-mentioned metals; or other conductive material.

Figure 2E:
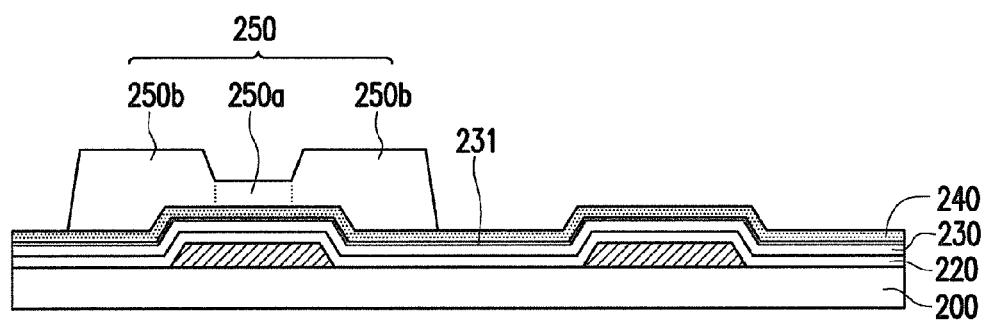

Next, referring to FIG. 2E, after completing the second conductive layer 240, a photoresist layer 250 is formed on the second conductive layer 240 over the gate 212. As shown by FIG. 2E, the photoresist layer 250 is divided into a first photoresist block 250a and a second photoresist block 250b connected to the both sides of the first photoresist block 250a, and the first photoresist block 250a is thinner than the second photoresist block 250b. Then, the photoresist layer 250 is used as a mask to perform a first etching process on the second conductive layer 240 and the semiconductor layer 230.

Figure 2F:
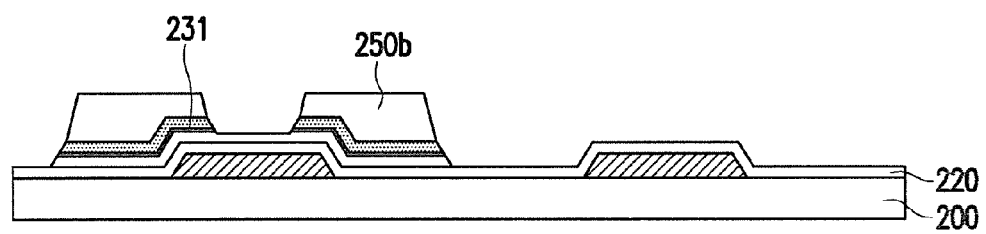

Next, referring to FIG. 2F, the photoresist layer 250 is reduced until the first photoresist block 250a is completely removed, wherein the method to reduce the photoresist layer 250 includes, for example, an ashing process. Continuing to refer FIG. 2F, after the first photoresist block 250a is completely removed, the remained second photoresist block 250 is used as a mask to conduct a second etching process on the second conductive layer 240. In the embodiment, the first etching process and the second etching process include, for example, a wet etching. In other embodiments, the etching processes can be a dry etching process as well.

Figure 2G:
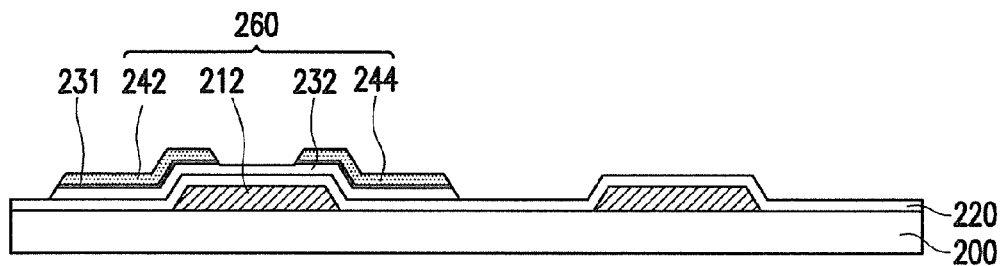

Next, referring to FIG. 2G, after removing the residue photoresist layer 250, the remaining second conductive layer 240 forms a source 242 and a drain 244, while the remaining semiconductor layer 230 forms a channel layer 232, wherein the source 242 and the drain 244 are disposed at the partial portions of the channel layer 232, and the gate 212, the channel layer 232, the source 242 and the drain 244 together form a TFT 260. In the present embodiment, the process of removing the photoresist layer 250 includes, for example, wet etching process.

Note that unlike the prior art, the channel layer 232, the source 242 and the drain 244 are simultaneously formed, which would reduce the number of photolithography and etching processes and thereby simplify the process. In addition, the channel layer 232, the source 242 and the drain 244 are formed by using, for example, a halftone mask process or graytone mask pocess. Besides, in other embodiments, prior to forming the second conductive layer 240 and the photoresist layer 250 (shown by FIG. 2D), an ohmic contact layer 231 is formed on the surface of the semiconductor layer 230, followed by performing the first etching process and the second etching process to remove a portion of the ohmic contact layer 231, as shown in FIG. 2F. For example, an ion doping process is performed on the surface of the semiconductor layer 230 to reduce the contact impedance between the semiconductor layer 230 and the second conductive layer 240.

Figure 2H:
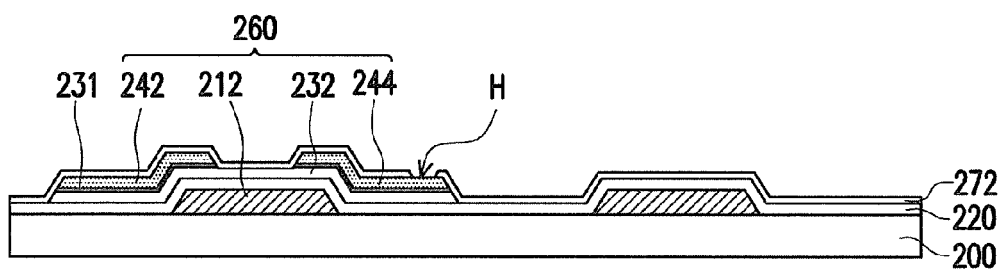

Next, referring to FIG. 2H, a patterned passivation layer 272 is formed on the TFT 260, wherein a portion of the drain 244 is exposed as shown in FIG. 2H. The patterned passivation layer 272 comprises, for example, a via hole H to expose the drain 244. In the embodiment, a method of forming the patterned passivation layer 272 includes, for example, after forming the TFT 260, a passivation layer 270 (shown in FIG. 3A) is formed on the TFT 260 and the gate dielectric layer 220. Next, the passivation layer 270 is patterned, wherein the method of patterning the passivation layer 270 includes, for example, a photolithography and etching process.

Figure 2I:
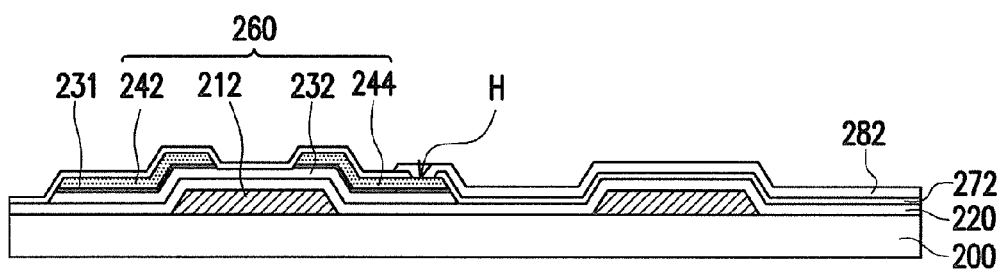
Figure 6A:
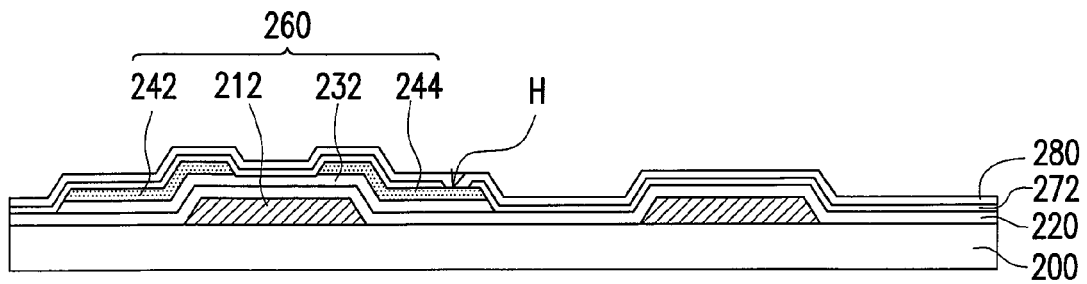
FIGS. 6A-6C are diagrams showing a laser ablation process for forming a pixel electrode.
Figure 6B:
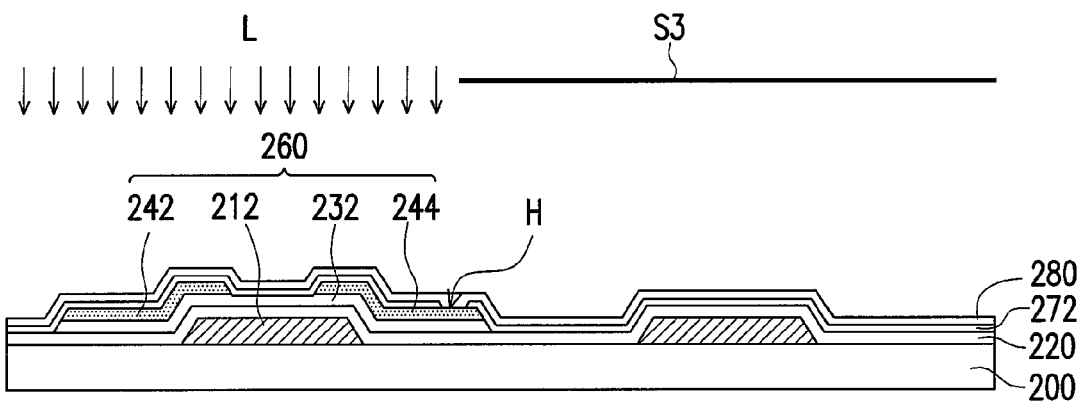
Figure 6C:
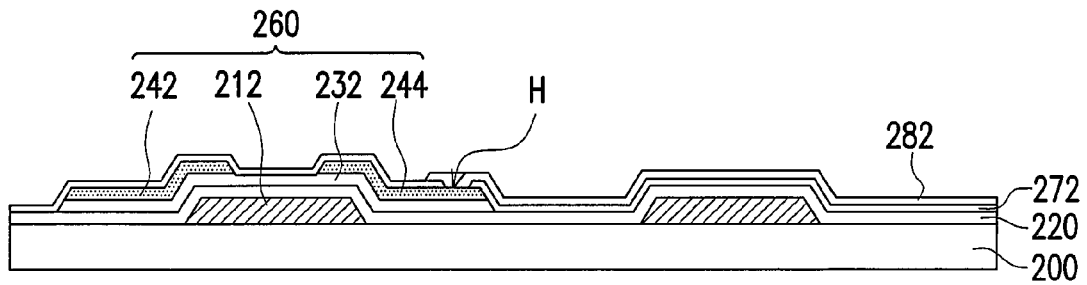

Next, referring to FIG. 2I, a pixel electrode 282 is formed on the patterned passivation layer 272. In the embodiment, the pixel electrode 282 is electrically connected to the drain 244 through the via hole H. In the embodiment, the method of forming the pixel electrode 282 includes, for example, after forming the patterned passivation layer 272, an electrode material layer 280 is formed on the passivation layer 270 and the drain 244, followed by patterning the electrode material layer 280 as shown in FIGS. 6A-6C.

Figure 3A:
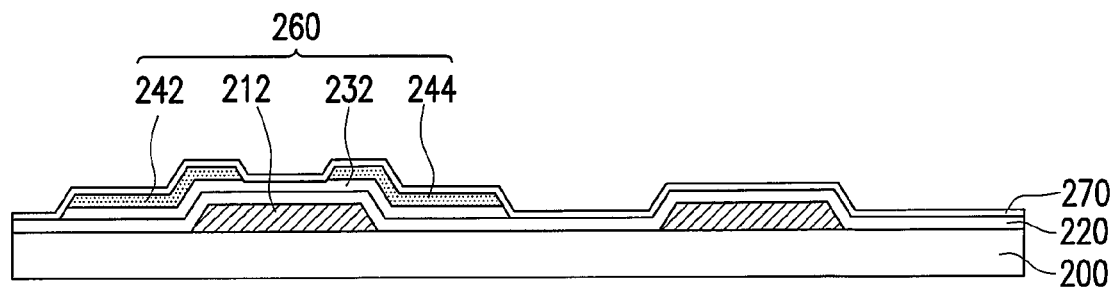
FIGS. 3A-3C are diagrams showing a laser ablation process for forming a patterned passivation layer.
Figure 3B:
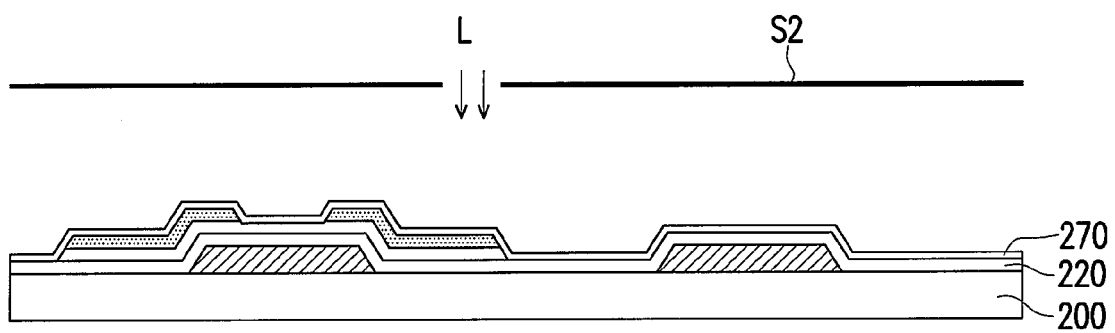
Figure 3C:
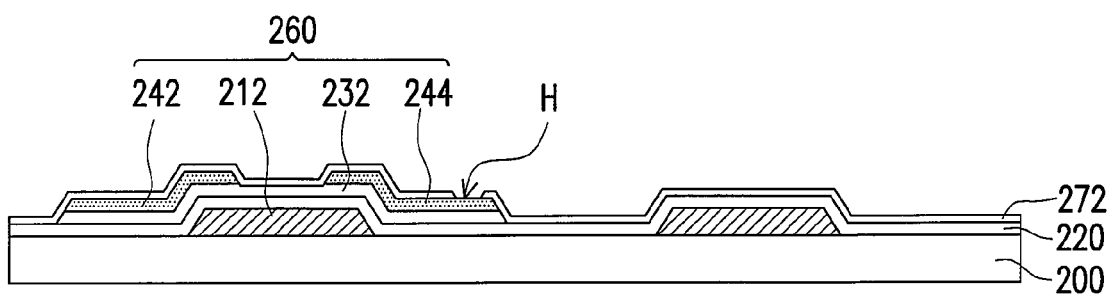

The above-mentioned patterned passivation layer 272 can be completed by using a laser ablation process as well. FIGS. 3A-3C are diagrams showing a laser ablation process to form a patterned passivation layer. Referring to FIG. 3A, after forming the TFT 260, a passivation layer 270 is formed on the gate dielectric layer 220 and the TFT 260, wherein the material of the passivation layer 270 includes, for example, silicon nitride or silicon oxide, and the method of forming the passivation layer includes, for example, a physical vapour deposition (PVD) process or a CVD process to deposit the above-mentioned material on the substrate 200. Next, referring to FIG. 3B, a second shadow mask S2 is disposed over the passivation layer 270 and the second shadow mask S2 exposes a portion of the passivation layer 270. Next, a laser L is applied through the second shadow mask S2 to irradiate the passivation layer 270. After the irradiation of the laser L, the passivation layer 270 absorbs the energy of the laser L so as to be ablated from the surface of the TFT 260. After that, as shown in FIG. 3C, after removing the partial passivation layer 270 exposed by the second shadow mask S2, the patterned passivation layer 272 exposing the via hole H is formed.

Figure 4A:
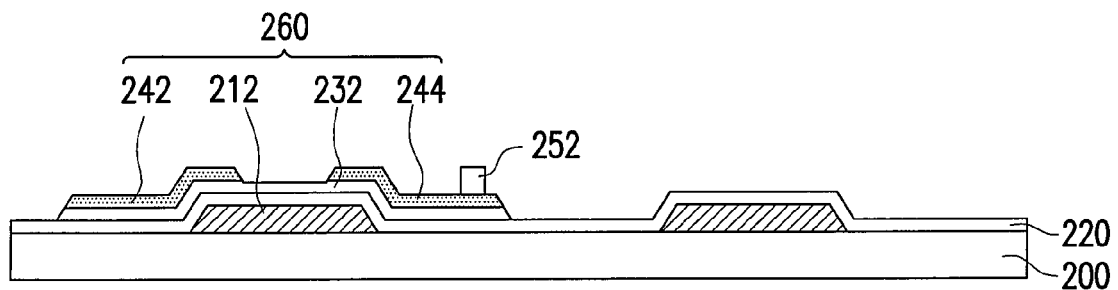
FIGS. 4A-4C are diagrams illustrating a method for fabricating a patterned passivation layer.
Figure 4B:
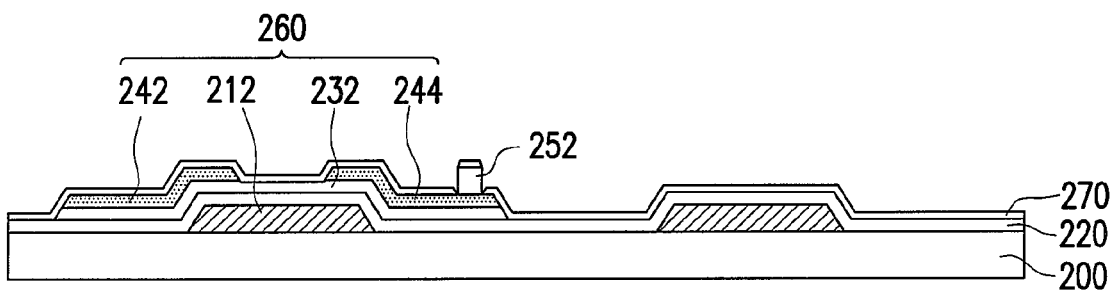
Figure 4C:
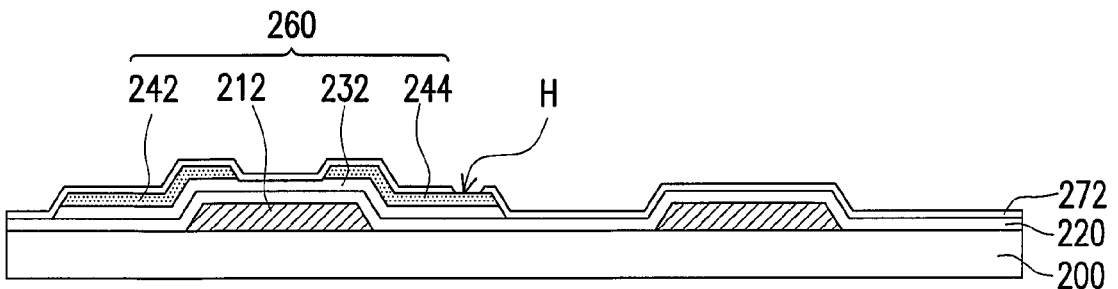

In other embodiments, a method of forming the patterned passivation layer 272 can be others as shown by FIGS. 4A-4C. First, referring to FIG. 4A, after forming the TFT 260, a photoresist layer 252 is formed on a portion of the drain 244. Next referring to FIG. 4B, a passivation layer 270 is formed to cover the gate dielectric layer 220, the TFT 260 and the photoresist layer 252. Next, referring to FIG. 4C, the photoresist layer 252 is removed so as to remove the passivation layer 270 on the photoresist layer 252 as well and a patterned passivation layer 272 with via hole H exposing a portion of drain is formed. In the embodiment, the method of removing the photoresist layer 252 includes, a laser lift-off process.

Figure 5A:
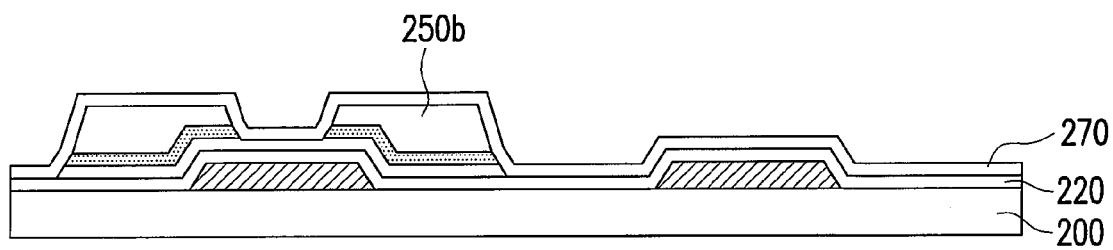
FIGS. 5A-5B are diagrams illustrating a method for forming a patterned passivation layer according to another embodiment of the present invention.
Figure 5B:
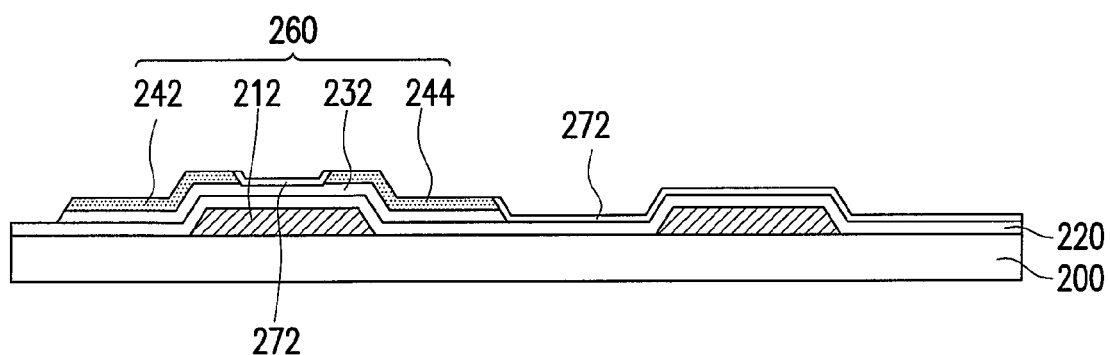

FIGS. 5A-5B are diagrams illustrating another fabrication method for forming a patterned passivation layer. First, referring to FIG. 5A, a method of forming the patterned passivation layer 272 includes forming a passivation layer 270 on the gate dielectric layer 220 and the remaining second photoresist block 250b prior to removing the remained second photoresist block 250b. Next, referring to FIG. 5B, after removing the remaining second photoresist block 250b, the passivation layer 270 is removed with the second photoresist block 250b simultaneously so as to form the patterned passivation layer 272. In the embodiment, the method of removing the photoresist layer 252 includes, for example, a laser lift-off process.

In addition, the method of forming the above-mentioned pixel electrode 282 can be a laser ablation process. FIGS. 6A-6C are diagrams showing a laser ablation process for forming a pixel electrode. First, referring to FIG. 6A, after forming the patterned passivation layer 272, an electrode material layer 280 is formed on the patterned passivation layer 272, wherein the method of forming the electrode material layer 280 includes, for example, a sputtering process for forming an ITO layer or an IZO layer. Next, referring to FIG. 6B, a third shadow mask S3 is disposed over the electrode material layer 280 and the third shadow mask S3 exposes a portion of the electrode material layer 280, followed by applying laser L through the third shadow mask S3 to irradiate the electrode material layer 280. Next, referring to FIG. 6C, after removing the partial electrode material layer 280 exposed by the third shadow mask S3, a pixel electrode 282 electrically connecting to the drain through the via hole H is accomplished.

Figure 7A:
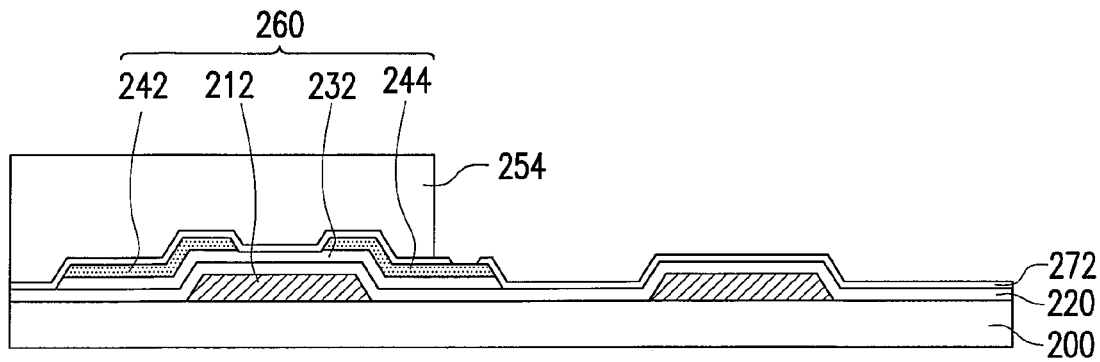
FIGS. 7A-7C are diagrams showing a laser ablation process for forming a pixel electrode.
Figure 7B:
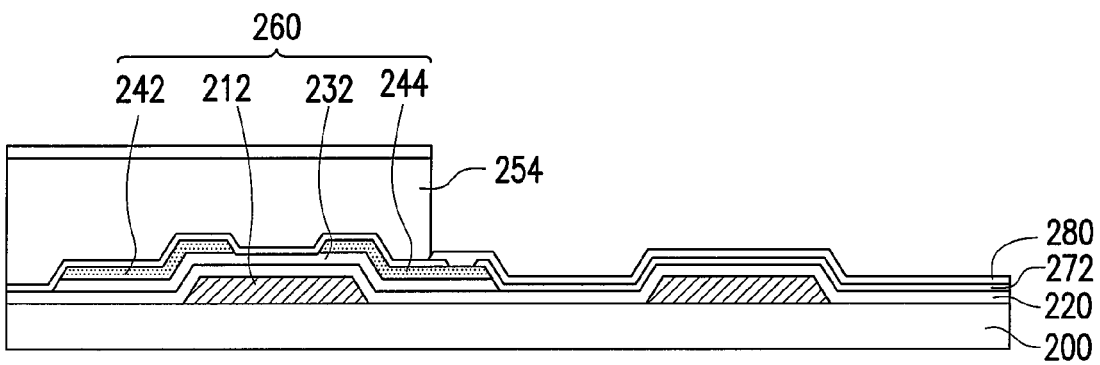
Figure 7C:
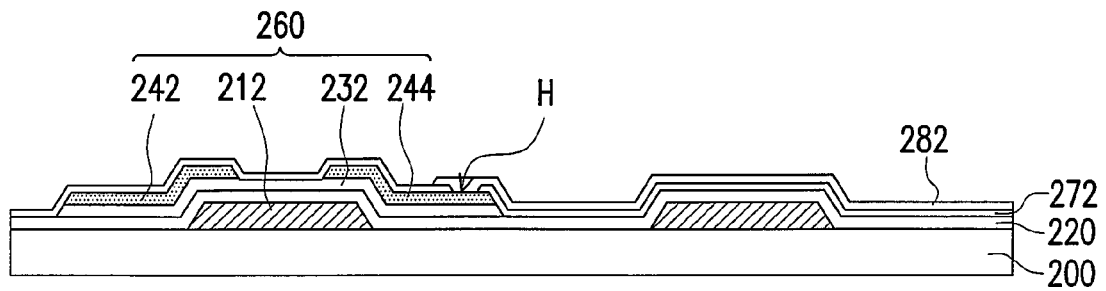

In other embodiments, a method of forming the pixel electrode 282 can be other methods as shown by FIGS. 7A-7C. First, referring to FIG. 7A, after forming the patterned passivation layer 272, a photoresist layer 254 is formed on the patterned passivation layer 272, wherein the photoresist layer 254 exposes a portion of the drain 244. Next, referring to FIG. 7B, an electrode material layer 280 is formed to cover the patterned passivation layer 272, the drain 244 and the photoresist layer 254. Next, referring to FIG. 7C, the electrode material layer 280 above the photoresist layer 254 is removed with photoresist layer 254 simultaneously and the remaining electrode material layer 280 forms the pixel electrode 282. The above-mentioned method of removing the photoresist layer includes, for example, a laser lift-off process.

Figure 8A:
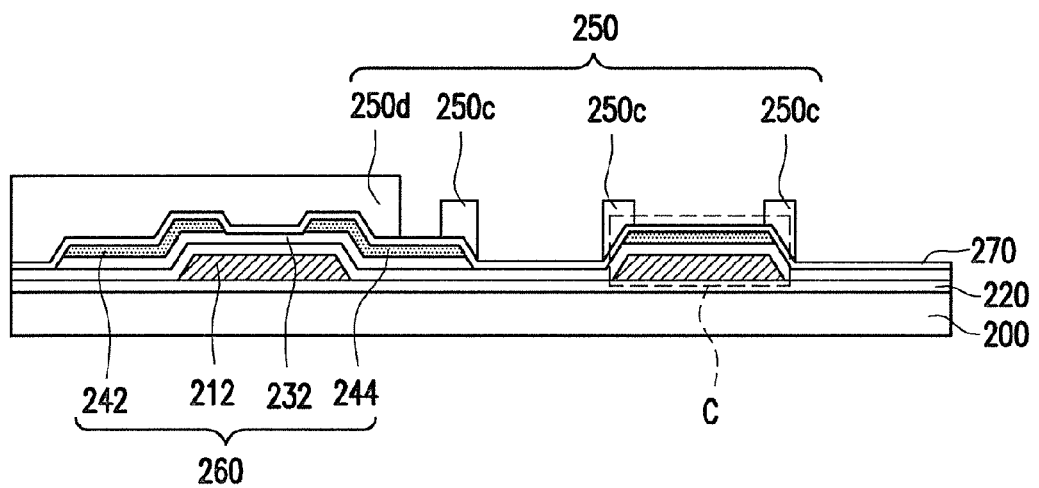
FIGS. 8A-8D are diagrams showing a method for forming a patterned passivation layer and a pixel electrode.
Figure 8B:
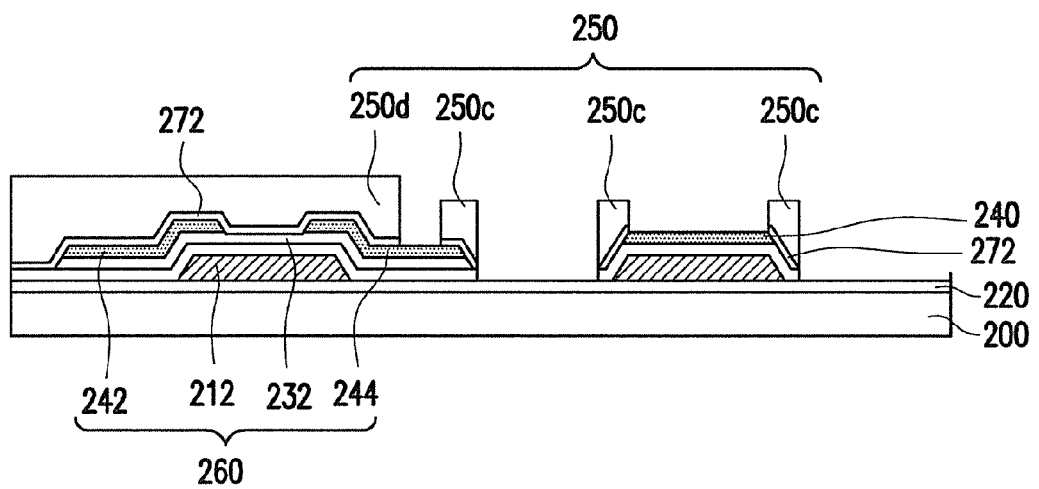

FIGS. 8A-8D are diagrams showing yet another fabrication method for forming a patterned passivation layer and a pixel electrode. First, referring to FIG. 8A, a passivation layer 270 is deposited on the gate dielectric layer 220 and the TFT 260, and then a photoresist layer 250 is formed on the passivation layer 270, and the photoresist layer 250 is divided into a third photoresist block 250c and a fourth photoresist block 250d. The third photoresist block 250c is disposed on the edge of the drain 244 and the edge of a storage capacitor C for avoiding the second conductive layer 240 in the successive process from being etched in excess to produce an under cut of the gate dielectric layer 220 on the slope region of the stacked films of the TFT 260 and the storage capacitor C. The fourth photoresist block 250d is located on the TFT 260 and the third photoresist block 250c is thinner than the fourth photoresist block 250d, wherein the material of the photoresist layer 250 includes, for example, organic material. Next, referring to FIG. 8B, the photoresist layer 250 is used as a mask to conduct an etching process on the passivation layer 270 so as to expose the partial drain 244 of the partial TFT 260 and to form a patterned passivation layer 272 as shown by FIG. 8B.

Figure 8C:
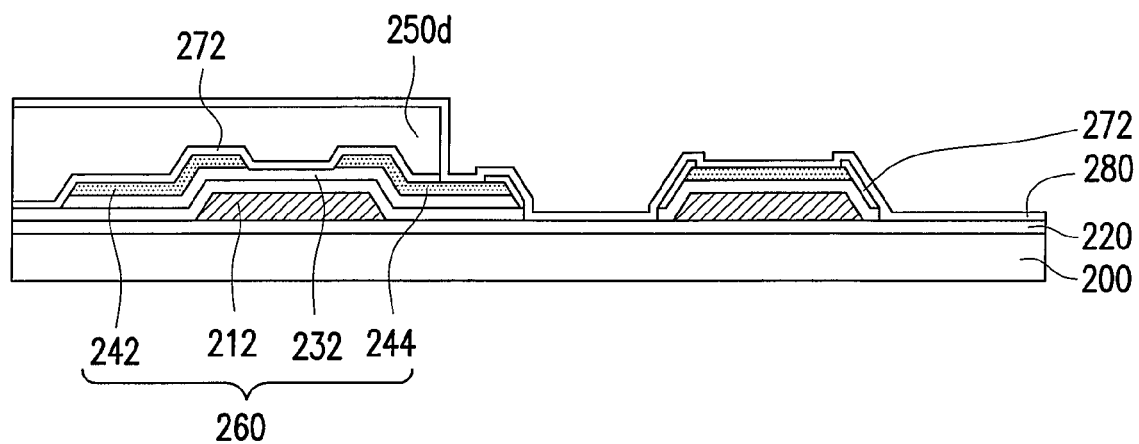
Figure 8D:
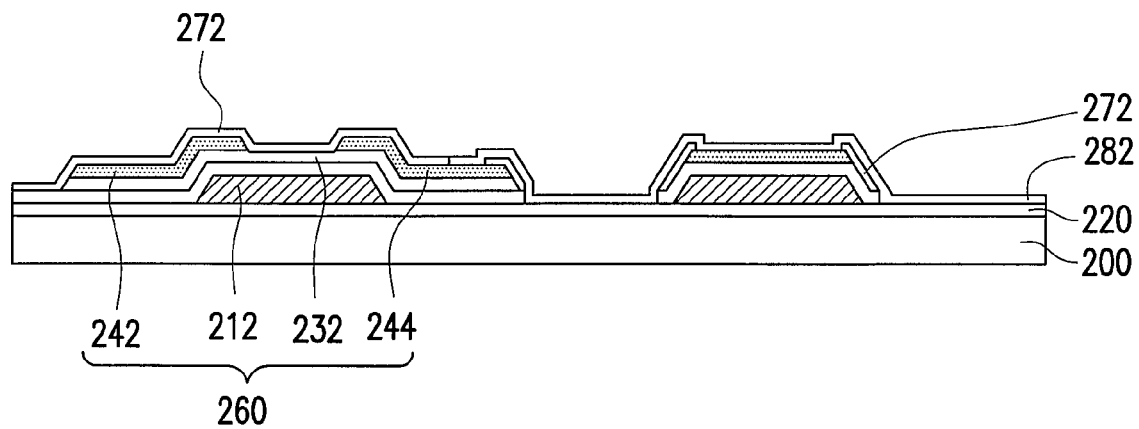

Next, referring to FIG. 8C, the thickness of the photoresist layer 250 is reduced until the third photoresist block 250c is completely removed. After completely removing the third photoresist block 250c, only the fourth photoresist block 250d remains. After that, an electrode material layer 280 is deposited to cover the fourth photoresist block 250d, the partially exposed drain 244 of the TFT 260, a portion of the substrate 200 and the patterned passivation layer 272. Further, the electrode material layer 280 located on the remaining photoresist block 250d is removed with the photoresist block 250d simultaneously. The remaining conductive layer forms the pixel electrode 282 as shown by FIG. 8D, and the pixel electrode 282 is electrically connected to the drain 244 of the TNT 260.

In summary, the present invention is advantageous in simultaneously fabricating the channel layer, the source and the drain, which contributes to reduce the process steps. In addition, the present invention uses laser L for irradiation to form the gate, which is different compared to the conventional photolithography and etching process. Therefore, the method for fabricating a pixel structure provided by the present invention has at least following advantages.

1. In the method for fabricating a pixel structure of the present invention, the gate process does not need a photolithography process. Thus, number of photolithography and etching processes may be reduced and the overall fabrication cost may be reduced.

2. Since the number of the process steps to fabricate a pixel structure is reduced, thus, an excessive long photolithography and etching process (including, for example, photoresist coating, soft oven-curing, hard oven-curing, exposing, developing, etching and photoresist removing) can be replaced by a simplified process through shadow mask and accordingly the defects occurring during photolithography and etching process can be reduced.

3. The method of removing a portion of the passivation layer by using a laser ablation process can further be used to repair a pixel electrode, where the possible ITO residue or IZO residue in a pixel structure process can be removed, which contributes to solve short-circuit problem between the pixel electrodes and increase the production yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pixel structure, comprising:
providing a substrate;
forming a first conductive layer on the substrate;
providing a first shadow mask over the first conductive layer, wherein the first shadow mask exposes a portion of the first conductive layer;
applying a laser through the first shadow mask to irradiate the first conductive layer to remove the portion of the first conductive layer exposed by the first shadow mask to form a gate;
forming a gate dielectric layer on the substrate to cover the gate;
simultaneously forming a channel layer, a source and a drain on the gate dielectric layer over the gate, wherein the source and the drain are disposed on a portion of the channel layer, and the gate, the channel layer, the source and the drain together form a thin film transistor;
forming a photoresist layer only on a portion of the drain;
forming a passivation layer to cover the gate dielectric layer, the thin film transistor and the photoresist layer;
removing the photoresist layer so as to remove the passivation layer on the photoresist layer to form a patterned passivation layer, wherein the patterned passivation layer exposes a portion of the drain; and forming a pixel electrode electrically connecting to the drain.

2. The method for fabricating a pixel structure according to claim 1, wherein a method of simultaneously forming the channel layer, the source and the drain comprises:
    forming a semiconductor layer on the gate dielectric layer;
    forming a second conductive layer on the semiconductor layer;
    forming a photoresist layer on the second conductive layer over the gate; wherein the photoresist layer is divided into a first photoresist block and a second photoresist block located at both sides of the first photoresist block, and a thickness of the first photoresist block is less than a thickness of the second photoresist block;
    performing a first etching process on the second conductive layer and the semiconductor layer using the photoresist layer as a mask ;
    reducing the thickness of the photoresist layer until the first photoresist block is completely removed; and
    performing a second etching process on the second conductive layer using a remaining portion of the second photoresist block, wherein the remaining portion of the second conductive layer forms the source and the drain, and a remaining portion of the semiconductor layer forms the conductive layer.

3. The method for fabricating a pixel structure according to claim 2, wherein a method of reducing the thickness of the photoresist layer comprises performing an ashing process.

4. A method for fabricating a pixel structure, comprising:
    providing a substrate;
    forming a first conductive layer on the substrate;
    providing a first shadow mask over the first conductive layer, wherein the first shadow mask exposes a portion of the first conductive layer;
    applying a laser through the first shadow mask to irradiate the first conductive layer to remove the portion of the first conductive layer exposed by the first shadow mask to form a gate;
    forming a gate dielectric layer on the substrate to cover the gate;
    forming a semiconductor layer on the gate dielectric layer;
    forming a second conductive layer on the semiconductor layer;
    forming a photoresist layer on the second conductive layer over the gate; wherein the photoresist layer is divided into a first photoresist block and a second photoresist block located at both sides of the first photoresist block, and a thickness of the first photoresist block is less than a thickness of the second photoresist block;
    performing a first etching process on the second conductive layer and the semiconductor layer using the photoresist layer as a mask;
    reducing the thickness of the photoresist layer until the first photoresist block is completely removed; and
    performing a second etching process on the second conductive layer using a remaining portion of the second photoresist block, wherein the remaining portion of the second conductive layer forms the source and the drain, and a remaining portion of the semiconductor layer forms the channel layer, wherein the source and the drain are disposed on a portion of the channel layer, and the gate, the channel layer, the source and the drain together form a thin film transistor;
    forming a passivation layer on the gate dielectric layer and a remaining second photoresist block;
    removing the remaining second photoresist block from the drain so as to remove the passivation layer on the second photoresist block to form a patterned passivation layer, wherein the patterned passivation layer exposes a portion of the drain; and
    forming a pixel electrode electrically connecting to the drain.

5. The method for fabricating a pixel structure according to claim 4, wherein after forming the passivation layer on the gate dielectric layer and the remaining second photoresist block, removing the remaining second photoresist block only from the drain so as to remove the passivation layer on the second photoresist block to form the patterned passivation layer.

6. The method for fabricating a pixel structure according to claim 1, wherein the method of removing the photoresist layer comprises a laser lift-off process.

7. The method for fabricating a pixel structure according to claim 2, wherein a method of faulting the channel layer, the source and the drain comprises:
    forming an ohmic contact layer on the surface of the semiconductor layer after forming the pixel electrode; and
    performing a first etching process and a second etching process to remove the ohmic contact layer exposed by the second photoresist block.

8. The method for fabricating a pixel structure according to claim 1, wherein a method of forming the pixel electrode comprises:
    forming an electrode material layer on the patterned passivation layer and the drain; and
    patterning the electrode material layer.

9. The method for fabricating a pixel structure according to claim 8, wherein the method of forming the electrode material layer comprises performing a sputtering process to form an indium tin oxide layer (ITO layer) or an indium zinc oxide layer (IZO layer).

10. The method for fabricating a pixel structure according to claim 1, wherein a method of forming the pixel electrode comprises:
    forming an electrode material layer on the patterned passivation layer and the drain;
    providing a third shadow mask, wherein the third shadow mask exposes a part of the electrode material layer; and
    applying a laser through the third shadow mask to irradiate the electrode material layer to remove the part exposed by the third shadow mask of the electrode material layer.

11. The method for fabricating a pixel structure according to claim 10, wherein the method of forming the electrode material layer comprises using a sputtering process to form an indium tin oxide layer (ITO layer) or an indium zinc oxide layer (IZO layer).

12. The method for fabricating a pixel structure according to claim 1, wherein a method of forming the pixel electrode comprises:
    forming a photoresist layer on the patterned passivation layer, wherein the photoresist layer exposes a portion of the drain;
    forming an electrode material layer to cover the patterned passivation layer, the drain and the photoresist layer; and
    removing the photoresist layer so as to remove the electrode material layer on the photoresist layer.

13. The method for fabricating a pixel structure according to claim 12, wherein the method of removing the photoresist layer comprises a laser lift-off process.

14. The method for fabricating a pixel structure according to claim 12, wherein the method of forming the electrode material layer comprises using a sputtering process to form an indium tin oxide layer (ITO layer) or an indium zinc oxide layer (IZO layer).

15. The method for fabricating a pixel structure according to claim 1, wherein the energy per unit area of the laser range from 10 mJ/cm$^2$ to 500 mJ/cm$^2$.

16. The method for fabricating a pixel structure according to claim 1, wherein the wavelength of the laser is between 100 nm and 400 nm.

17. A method for fabricating a pixel structure, comprising:

providing a substrate;

forming a first conductive layer on the substrate;

providing a first shadow mask over the first conductive layer, wherein the first shadow mask exposes a portion of the first conductive layer;

applying a laser through the first shadow mask to irradiate the first conductive layer to remove the portion of the first conductive layer exposed by the first shadow mask to form a gate;

forming a gate dielectric layer on the substrate to cover the gate;

simultaneously forming a channel layer, a source and a drain on the gate dielectric layer over the gate, wherein the source and the drain are disposed on a portion of the channel layer, and the gate, the channel layer, the source and the drain together form a thin film transistor;

forming a passivation layer on the gate dielectric layer and the thin film transistor;

forming a photoresist layer on the passivation layer to pattern the passivation layer so as to form a patterned passivation layer, wherein the photoresist layer exposes a portion of the drain and the gate dielectric layer, wherein the photoresist layer is divided into a third photoresist block and a fourth photoresist block, and a thickness of the third photoresist block is less than a thickness of the fourth photoresist block;

reducing a thickness of the photoresist layer until the third photoresist block is completely removed;

forming an electrode material layer to cover the patterned passivation layer, the drain and the fourth photoresist layer; and removing the fourth photoresist layer so as to remove the electrode material layer on the fourth photoresist layer such that a pixel electrode electrically connecting to the drain is formed.

* * * * *